(12) United States Patent
Gindele et al.

(10) Patent No.: US 11,545,808 B2
(45) Date of Patent: Jan. 3, 2023

(54) LIGHT CONVERSION DEVICES AND METHODS FOR PRODUCING

(71) Applicant: SCHOTT AG, Mainz (DE)

(72) Inventors: Frank Gindele, Schweitenkirchen (DE); Edgar Pawlowski, Stadecken-Elsheim (DE); Christian Rakobrandt, Schwindegg (DE); Christoph Stangl, Buch am Erlbach (DE)

(73) Assignee: SCHOTT AG, Mainz (DE)

( * ) Notice: Subject to any disclaimer, the term of this patent is extended or adjusted under 35 U.S.C. 154(b) by 187 days.

(21) Appl. No.: 16/989,690

(22) Filed: Aug. 10, 2020

(65) Prior Publication Data

US 2021/0044073 A1  Feb. 11, 2021

(30) Foreign Application Priority Data

Aug. 9, 2019 (DE) ...................... 10 2019 121 515.3

(51) Int. Cl.
*H01S 3/04* (2006.01)
*H01S 3/067* (2006.01)
*F21S 41/176* (2018.01)
*F21S 45/47* (2018.01)

(52) U.S. Cl.
CPC .......... *H01S 3/0405* (2013.01); *F21S 41/176* (2018.01); *F21S 45/47* (2018.01); *H01S 3/06704* (2013.01)

(58) Field of Classification Search
CPC ......... F21V 9/30; F21S 41/176; H01S 3/0405
See application file for complete search history.

(56) References Cited

U.S. PATENT DOCUMENTS

| 9,614,131 | B2* | 4/2017 | Göötz | ................. H01L 33/58 |
| 9,890,918 | B2* | 2/2018 | Singer | ................. F21V 9/08 |
| 11,054,112 | B2* | 7/2021 | Shimizu | ............... H01L 33/508 |
| 2014/0169024 | A1 | 6/2014 | Hager | |
| 2015/0311407 | A1 | 10/2015 | Göötz | |
| 2015/0338044 | A1 | 11/2015 | Singer | |
| 2016/0146434 | A1 | 5/2016 | Mönch | |
| 2017/0062672 | A1 | 3/2017 | Göötz | |
| 2020/0263850 | A1 | 8/2020 | Kawaguchi | |

FOREIGN PATENT DOCUMENTS

| DE | 102012112994 | 6/2014 |
| DE | 102012223854 | 6/2014 |
| DE | 102013107227 | 1/2015 |
| DE | 112015001180 | 12/2016 |
| WO | 2014090893 | 6/2014 |
| WO | 2017104167 | 6/2017 |

* cited by examiner

*Primary Examiner* — Matthew J. Peerce
(74) *Attorney, Agent, or Firm* — Ruggiero McAllister & McMahon LLC

(57) ABSTRACT

A light conversion device is provided that includes a main body and a light conversion arrangement. The main body includes heatsink and is on a back side of the light conversion arrangement. The light conversion arrangement has a front side with light conversion elements separated from one another at least regionally by a trench. The light conversion elements, when irradiated with primary light on the front side, are configured to emit secondary light having a different wavelength from the front side.

23 Claims, 7 Drawing Sheets

LIGHT CONVERSION DEVICES AND METHODS FOR PRODUCING

CROSS REFERENCE TO RELATED APPLICATIONS

This application claims the benefit under 35 USC 119 of German application 10 2019 121 515.3 filed on Aug. 9, 2019, the contents of which are incorporated by reference herein.

BACKGROUND

1. Field of the Invention

The invention relates to a light conversion device comprising a main body, which is embodied in particular as a heat sink, and an arrangement of light conversion elements applied thereon, and to a corresponding light conversion arrangement and corresponding production methods.

2. Description of Related Art

Lighting devices are known in various embodiments, for example so-called discharge and halogen lamps. For various reasons, for example with regard to the energy efficiency or in order to provide lighting devices having a small space requirement, preferably in conjunction with a high luminance, there is increasing interest, however, in lighting devices based on laser light sources. These are generally constructed such that they comprise at least one laser light source, for example a laser diode, and a light conversion element.

The light conversion element serves to take up the light from the laser light source and to emit it again with a different wavelength because the light emitted by the laser light source or by the laser light sources generally does not have the desired, for example color-neutral, "white" color locus. The light conversion element is able, after being irradiated with the light from the laser light source or the laser light sources, for example having a wavelength of 450 nm in the case of a blue laser, which is generally monochromatic, to convert said wavelength partially or completely into one or more other wavelengths or into a specific wavelength spectrum, such that a light image having a desired, specified color locus can be generated by additive color mixing of the scattered light and the converted light.

The light conversion element is also referred to as convertor, for example Ce:YAG, luminophore or (engl.) phosphor, wherein the German term "Phosphor" ["phosphorus"; "phosphor"] here should not be understood in the sense of the chemical element phosphorus, but rather relates to the property of these substances to luminesce. Within the meaning of the present disclosure, therefore, the German term "Phosphor", unless expressly explained otherwise, should always be understood as a phosphor, but not the chemical element phosphorus.

Such lighting devices based on laser light sources are of particular importance in particular because a high luminance can be achieved in this way, which may be relevant in particular for applications in the automotive sector.

It is often an aim to achieve a particularly high luminance even and precisely in the case of low laser power, in order not only to obtain a high luminance but also to minimize the energy consumption. This can be achieved by generating a light spot having only small dimensioning, for example only a small diameter, for example less than 500 micrometers, but with correspondingly high luminance.

The phosphor used can be operated in transmission, on the one hand, and also in reflection, on the other hand. Phosphors (light conversion elements) used are often embodied in planar fashion as slices and in direct contact with an LED chip.

In this regard, WO 2014/090893 A1 describes a wavelength conversion element disposed downstream of a semiconductor chip with a plurality of drivable elements in the emission direction, wherein each of the elements is suitable for generating primary radiation, and wherein the wavelength conversion element has a structuring into partial regions, wherein at least one individually drivable element of the semiconductor chip is assigned to each partial region of the wavelength conversion element.

DE 10 2012 223 854 A1 describes a remote phosphor convertor device comprising a mount and a convertor element held by said mount, and also a primary light emission element configured such that a primary light emitted by the latter can be directed onto the convertor element.

WO 2017/104167 A1 describes a lighting device and a vehicle headlight. The lighting device comprises a device for emitting light having a phosphor that emits light when it is excited by light from a laser element, and also a mirror, which is movable and moves continuously according to a predetermined routine.

SUMMARY

It has been found, however, that the known lighting devices are in need of further improvement with regard to luminance, the stability of the lighting properties, use over a wide temperature range, a luminous spot having a defined and constant size and high precision, which at the same time can be varied spatially, and/or reduction of crosstalk of a plurality of channels.

Therefore, it is an object of the invention to specify a lighting device and respectively components for a lighting device and respectively corresponding production methods with which the disadvantages described above can be overcome.

This object is achieved by the present invention.

The invention specifies a light conversion device comprising a main body, which is embodied in particular as a heat sink, and a light conversion arrangement applied indirectly or directly on the main body. The rear side of the light conversion arrangement faces the main body and the front side of said light conversion arrangement faces away from the main body.

In this case, the light conversion arrangement arranged on the main body comprises a plurality of light conversion elements, which are in each case separated from one another at least regionally by a trench. The light conversion elements are accordingly arranged adjacent to one another on the main body and form the light conversion arrangement, wherein directly adjacent light conversion elements are spaced apart from one another by a trench. A trench can extend in particular from the front side of the light conversion arrangement at least 25% in the direction of the rear side, i.e. according to height, preferably at least 50%, and particularly preferably can even separate the adjacent light conversion elements from one another at least regionally completely according to height. Transversely or perpendicularly to the height, the light conversion elements need not be completely separated from one another by trenches; a partial separation can also be provided, such that no individual, separate, separated light conversion elements are present, rather the light conversion elements are connected and are in each case formed or defined by a region of the light conversion arrangement. In one preferred embodiment, however, the light conversion elements are completely separated from one another by trenches transversely or perpendicularly to the height. In addition, provision can be made for the light conversion elements also to be completely separated from one another according to height. In this case, the light conversion arrangement accordingly consists of a plurality of individual, separate or separated light conversion elements.

The front side of the light conversion elements facing away from the main body is designed in each case to be illuminated with primary light and to emit secondary light having a different wavelength. Each light conversion element is accordingly configured to be illuminated with primary light on its front side and in turn to emit the secondary light on the front side, i.e. the light conversion elements are designed for reflection operation. In the reflection application, the phosphor can accordingly be advantageously cooled from the rear side.

With the light conversion device according to the invention, which can be used in particular in a lighting device with a laser for irradiating the light conversion elements with the primary light, it is advantageously possible to achieve a high luminance. This is of importance particularly for applications in the automotive sector, in the aircraft sector, in medical lighting and in the general lighting sector, such as stage spotlights, searchlights. It is thus possible to achieve a particularly high luminance even and precisely in the case of low laser power, in order not only to obtain a high luminance but also to minimize the energy consumption. For this purpose, it is also possible to provide a light spot having only small dimensioning, for example only a small diameter, but having correspondingly high luminance. Particularly in the abovementioned applications or in the application of scanning or spatially changing lighting situations, the invention advantageously makes it possible to obtain a high stability of the lighting parameters, such as the color coordinates or the luminance.

With the light conversion device according to the invention, which is configured in particular for use in a lighting device, a lighting device having very high luminance can be provided, preferably a lighting device having white light in which the luminous spot having a defined and constant size and high precision can be varied spatially. In this case, the lighting properties can be kept constant to a high degree. Moreover, the light conversion device or respectively a corresponding lighting device can be used in a wide temperature range.

Furthermore, with the light conversion device according to the invention, which is embodied in particular for use in a lighting device, it is possible to reduce or prevent crosstalk of individual channels during remote operation, which is advantageous particularly for dynamic light headlights/spotlights.

In one development of the invention, a trench by which at least adjacent light conversion elements are in each case separated from one another at least regionally can be filled with a filling material or solder material deviating from the material of the light conversion elements. Preferably, such a filling material or solder material has a coefficient of thermal expansion that differs from the coefficient of thermal expansion of the material of the light conversion elements as little as possible, in particular differs by less than $1*10^{-6}$ $K^{-1}$, preferably by less than $0.1*10^{-6}$ $K^{-1}$, particularly preferably by less than $0.01*10^{-6}$ $K^{-1}$. This has the advantage that stresses arise in the material microstructure as little as possible in the event of temperature changes.

As filling material or solder material, materials are considered, in particular, which comprise or consist of metal or an alloy, e.g. SnAgCu, AuSn or Ag, wherein Ag can be embodied as silver paste, for example. As filling material, materials are also considered which comprise or consist of glass or glass paste, in particular solder glass, or glass ceramic, in particular black glass.

As described, the light conversion device according to the invention has a plurality of light conversion elements. In one advantageous embodiment of the invention, said plurality of light conversion elements are arranged in one or more rows and/or one or more columns. The light conversion elements can thus be arranged adjacently in rows and/or in columns in order to form the light conversion arrangement. In particular, both a plurality of rows and a plurality of columns are provided, such that the light conversion elements are arranged in a grid or in a matrix.

For any type of arrangement of the light conversion elements, the latter can each have specific shapes. By way of example, a polygonal shape, in particular a rectangular, square or hexagonal shape, of the light conversion elements can be provided. However, the light conversion elements can also have a rounded shape, in particular a circular shape. The shape of the light conversion elements can be defined by the trenches or, in the case of only regional trenches, by the mental connection thereof, as is directly evident from the figures.

The light conversion elements, the useful area of which on the front side can be defined, as stated, by the trenches or the mental connection of trenches, preferably each have an area that is smaller than 1 square millimeter, preferably smaller than 0.25 square millimeter, particularly preferably smaller than 0.1 square millimeter.

As already described, at least adjacent light conversion elements are spaced apart, divided or separated from one another at least regionally, wherein a complete separation can also be provided, such that the light conversion arrangement consists of a plurality of individual, separate or completely separated light conversion elements. On the other hand, however, one advantageous embodiment provides for the light conversion elements also to be connected to one another regionally, in particular by one web or a plurality of webs. This can have the advantage that the light conversion elements are fixed relative to one another.

In the case where adjacent light conversion elements, on the one hand, are in each case separated from one another at least regionally by a trench and, on the other hand, are in each case connected to one another regionally by a web, provision is made, in particular, for the regional separation and connection, respectively, to be present perpendicularly to the height, where height is intended to denote the direction along the normal to the front side and rear side, respectively, of the light conversion elements. In other words, both the regional separation and the regional connection are present in the plane of the light conversion arrangement. To put it in yet another way, the trench which regionally separates adjacent light conversion elements and the web which regionally connects adjacent light conversion elements are preferably arranged next to one another, i.e. in particular not one above the other. In this case, arranged next to one another means that the trench and the web lie next to one another within that plane which is defined by the front side and the rear side, respectively, of the light conversion elements. That is to say that the trench and the web are in particular not spaced apart from one another only along the height.

The invention furthermore relates to a lighting device comprising a light conversion device, in particular as described above, and a light emission unit configured to emit the primary light for illuminating the front side of the light conversion elements. The light emission unit is accordingly configured to irradiate the light conversion elements with the primary light, wherein the light emission unit is arranged or configured so as to irradiate the light conversion elements with the primary light on their front side.

The light emission unit can be configured and/or arranged such that the primary light illuminates the front side of the light conversion elements in the region of a primary light receiving area, wherein the primary light receiving area has a size comparable to or smaller than the front side of a light conversion element. In other words, the convertor array can be irradiated, e.g. with a laser beam, wherein the spot size is preferably smaller than an array element.

The light emission unit can furthermore be configured and/or arranged such that the primary light receiving area within which the light conversion element is illuminated with the primary light is smaller than 1 square millimeter, preferably smaller than 0.25 square millimeter, particularly preferably smaller than 0.1 square millimeter.

The light emission unit that emits the primary light preferably has a radiation power of at least 0.5 W. Furthermore, provision can be made for the secondary light to have a luminance of at least 50 cd/mm$^2$.

The light emission unit is preferably arranged in such a way that the primary light is radiated in laterally onto the light conversion element, wherein the primary light is in particular radiated in along an optical axis that is at an angle of greater than 30 degrees, preferably greater than 45 degrees, particularly preferably greater than 60 degrees, with respect to a normal axis of the light conversion elements and/or with respect to an optical axis of the secondary light.

The light emission unit that emits the primary light can comprise a laser light source or be embodied as such. A laser light source is not necessarily comprised, however; by way of example, it may also be the case that just a light guide that emits the primary light is comprised, wherein the light guide, for its part, can be connected to a laser light source in order to couple the light into the light guide. The lighting device accordingly comprises at least one light emission unit configured to emit the primary light.

In one variant, the light emission unit can comprise a light source, in particular a laser light source, which is configured to emit the primary light for illuminating the light conversion elements.

Alternatively or additionally, provision can also be made for the light emission unit to comprise a light guide, in particular a fiber light guide, which is configured to emit the primary light for illuminating the light conversion elements.

The invention furthermore relates to a light conversion arrangement comprising a plurality of light conversion elements, which are in each case separated from one another at least regionally by a trench.

The statements made above are applicable, mutatis mutandis, for the light conversion arrangement. Accordingly, the trench by which the light conversion elements are in each case separated from one another at least regionally can be filled with a filling material or solder material that deviates from the material of the light conversion elements, wherein the filling material or solder material has in particular a coefficient of thermal expansion that differs from a coefficient of thermal expansion of the material of the light conversion elements by less than $1*10^-6$ K$^-1$, preferably by less than $0.1*10^-6$ K$^-1$, particularly preferably by less than $0.01*10^-6$ K$^-1$.

The filling material or solder material can in turn comprise metal or an alloy, in particular SnAgCu, AuSn or Ag, e.g. Ag paste, or else glass or glass paste, in particular solder glass, or glass ceramic, in particular black glass.

The light conversion elements of the light conversion arrangement can in turn be arranged in one or more rows and/or one or more columns, in particular in a matrix. Furthermore, the light conversion elements can each have a polygonal shape, in particular a rectangular, square or hexagonal shape, or a round shape, in particular a circular shape.

The front side of the light conversion elements can in turn preferably be smaller than 1 square millimeter, particularly preferably be smaller than 0.25 square millimeter, even more preferably be smaller than 0.1 square millimeter.

Moreover, provision can in turn be made for the light conversion elements of the light conversion arrangement to have, besides the regional separation from one another by a trench, at the same time in each case a regional connection, e.g. by a web.

The invention furthermore relates to a method for producing a light conversion device, wherein in this case the light conversion arrangement having the plurality of the light conversion elements is first fabricated from an original blank component. In other words, a (larger) original light conversion element is firstly taken as a basis and is then processed in order to produce the plurality of light conversion elements that together form the light conversion arrangement.

In the method, an original light conversion element and a main body, which is embodied in particular as a heat sink, are provided, the original light conversion element is arranged on the main body, and one trench or a plurality of trenches is/are introduced into the original light conversion element in such a way as to form a light conversion arrangement comprising a plurality of light conversion elements, which are in each case separated from one another at least regionally by the introduced trench or the introduced trenches.

In other words, firstly a large-area convertor slice is produced and the convertor is applied to a main body, e.g. a heat sink. Trenches, e.g. perpendicular trenches, are introduced into the convertor slice and a convertor array is thus produced. The trenches can be introduced by way of a laser ablation process, for example. The precision of the convertor elements and thus of the luminous points can thus be given by way of the laser structuring process.

As a result, a light conversion device can be produced in an advantageous manner, which light conversion device can be used for a lighting device, for example, wherein the plurality of light conversion elements, also referred to as a convertor array, can be produced optimally, such that there is hardly any or no crosstalk between the individual channels during remote operation and in a reflection arrangement, which is desirable particularly for dynamic light headlights/spotlights. In particular, a solution is specified for a lighting device and a convertor array having little crosstalk and for application in a wide temperature range.

In one advantageous method variant, the trench or trenches by which the light conversion elements are in each case separated from one another at least regionally can be filled with a filling material or solder material deviating from the material of the light conversion elements.

The trenches can be filled for example with a metal layer, as in the case of screen printing, or with black glass, wherein in particular virtually identical coefficients of thermal expansion are advantageous. Matching the coefficients of thermal expansion between the carrier material (convertor material) and the filling material/solder material, such as black glass, can make it possible to use the light conversion device and/or the lighting unit in a temperature range of from at least −60° C. up to at least 280° C. Fabricating the convertor array from convertor wafer production makes it possible to keep the tolerance of the lighting properties of array elements as low as possible.

Accordingly, the filling material has in particular a coefficient of thermal expansion that differs from a coefficient of thermal expansion of the material of the light conversion elements by less than $1*10^{-6}$ K$^{-1}$, preferably by less than $0.1*10^{-6}$ K$^{-1}$, particularly preferably by less than $0.01*10^{-6}$ K$^{-1}$.

The filling material/solder material can comprise metal or an alloy, in particular SnAgCu, AuSn or Ag, for example Ag paste, or simply glass or glass paste, in particular solder glass, or glass ceramic, for example black glass.

If, in the method, a plurality of trenches are introduced into the original light conversion element, in one process variant they can be introduced in the form of a matrix or in the form of a grid, in particular such that a light conversion arrangement having one or more rows and/or one or more columns, in particular a matrix or grid, of light conversion elements is formed.

In this case, the trenches or one trench can be introduced into the original light conversion element in such a way that the light conversion elements formed each have a polygonal shape, in particular a rectangular, square or hexagonal shape, or a round shape, in particular a circular shape.

Moreover, the trench or the trenches are introduced into the original light conversion element in such a way that the light conversion elements formed as a result each have a front side that is smaller than 1 square millimeter, preferably smaller than 0.25 square millimeter, particularly preferably smaller than 0.1 square millimeter.

In the process of introducing the trench or the trenches, the light conversion elements need not be formed in a manner completely separated from one another. It is also possible for the trench or the trenches to be introduced into the original light conversion element in such a way that the light conversion elements formed as a result, on the one hand, are in each case separated from one another regionally by a trench but, on the other hand, are in each case still connected to one another regionally by a web.

In one preferred method variant, the original light conversion element has an area of at least 0.1 square millimeter.

As already explained, a trench can be introduced into the material of the original light conversion element in particular by means of laser processing, such as laser ablation. In principle, introducing a trench can alternatively be effected by some other material-removing method, for example by means of laser drilling, etching (wet chemical etching) and/or bead blasting, sawing or similar methods.

The invention additionally also relates to a method for producing a light conversion arrangement comprising a plurality of light conversion elements, wherein the explanations above are in turn applicable, mutatis mutandis, for this as well. Accordingly, one trench or a plurality of trenches is or are introduced into an originally provided light conversion element in such a way as to form a light conversion arrangement comprising a plurality of light conversion elements, which are in each case separated from one another at least regionally by a trench.

Provision is preferably made for the trench or trenches in turn to be filled with a filling material deviating from the material of the light conversion elements, wherein the filling material has in particular a coefficient of thermal expansion that differs little or does not differ from a coefficient of thermal expansion of the material of the light conversion elements, in particular differs by less than $1*10^{-6}$ K$^{-1}$, preferably by less than $0.1*10^{-6}$ K$^{-1}$, particularly preferably by less than $0.01*10^{-6}$ K$^{-1}$.

The filling material can in turn comprise metal or an alloy, in particular SnAgCu, AuSn or Ag and/or glass or glass ceramic, in particular black glass.

Provision can in turn be made for the plurality of trenches to be introduced into the original light conversion element in such a way that a light conversion arrangement having one or more rows and/or one or more columns, in particular a matrix, of light conversion elements is formed. Furthermore, the trenches can be introduced into the original light conversion element in such a way that the plurality of light conversion elements formed each have a polygonal shape, in particular a rectangular, square or hexagonal shape, or a round shape, in particular a circular shape.

The trench or the trenches can be introduced into the original light conversion element in such a way that the light conversion elements formed as a result each have a front side that is smaller than 1 square millimeter, preferably smaller than 0.25 square millimeter, particularly preferably smaller than 0.1 square millimeter.

The trench or the trenches can be introduced into the original light conversion element in such a way that the light conversion elements formed as a result, on the one hand, are in each case separated from one another regionally by a trench but, on the other hand, are in each case still connected to one another regionally by a web.

The original light conversion element provided, into which the trenches are introduced, has preferably an area of at least 0.1 square millimeter, particularly preferably of at least 25 square millimeters, in particular greater than 100 square millimeters.

Introducing a trench can be effected by means of material-removing methods such as laser ablation, laser drilling, etching (wet chemical etching), sawing and/or bead blasting.

Finally, the invention also relates to a further method for producing a light conversion device, which takes as a basis, in particular, a light conversion arrangement that has already been produced by processing, as described above.

The method thus involves providing a light conversion arrangement comprising a plurality of light conversion elements, which are in each case separated from one another at least regionally by a trench, and a main body, which is embodied in particular as a heat sink. The light conversion arrangement is then arranged on the main body.

In this method for producing a light conversion device, before arranging the light conversion arrangement on the main body, a filling material can be applied on the light conversion arrangement or on the main body, and the filling material can preferably be heated, such that it becomes softer. As a result, arranging the light conversion arrangement on the main body can be effected with pressure being exerted, such that the filling material penetrates into the trench or the trenches, in particular in such a way that the trench is partly or completely filled with the filling material.

BRIEF DESCRIPTION OF THE DRAWINGS

The invention is explained in greater detail below with reference to some figures, in which.

DETAILED DESCRIPTION

Figure 1:
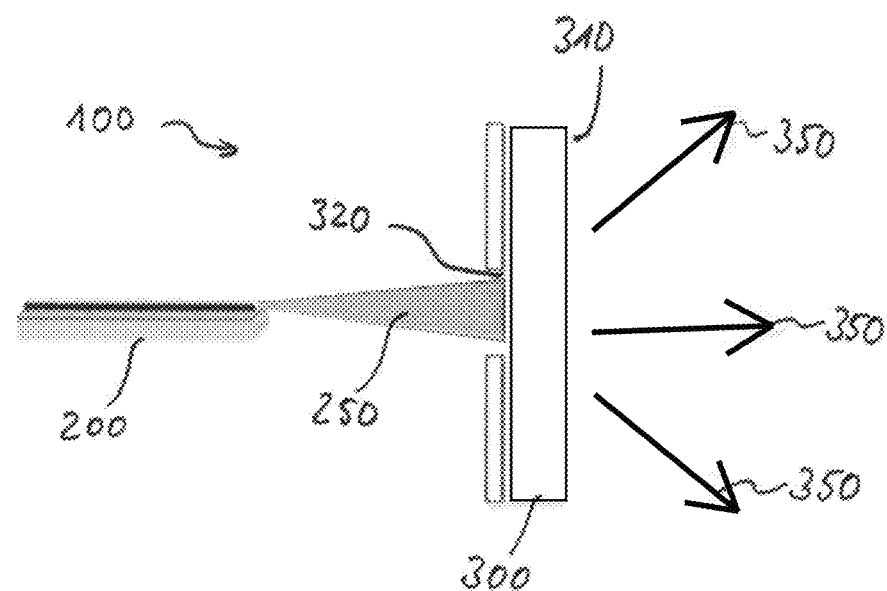
FIG. 1 shows a lighting device which is known from the prior art and in which a light conversion element (convertor) is used in transmission operation.

FIG. 1 shows a lighting device 100 which is known from the prior art and which is designed for transmission operation. The lighting device 100 comprises a light emission unit 200, which is embodied as a laser diode and radiates primary light 250, e.g. blue light, onto the rear side 320 of a light conversion element 300. The light conversion element 300 accordingly receives the primary light 250 on the rear side 320 and emits secondary light 350 on the front side 310.

Figure 2:
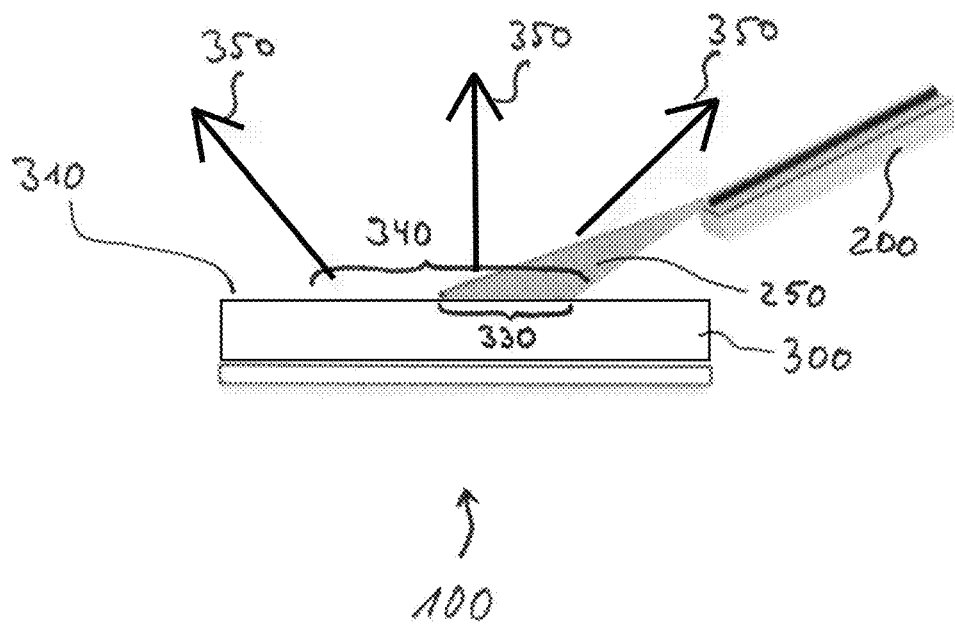
FIG. 2 shows a lighting device in which a convertor is used in reflection operation.

FIG. 2 shows a similar lighting device 100, but this lighting device is designed for reflection operation. Here, the light emission unit 200 radiates the primary light 250 onto the front side 310 of the light conversion element 300, wherein the front side is illuminated in the region of a primary light receiving area 330. The light conversion element 300 emits the secondary light 350 on the front side 310 in the region of a secondary light emitting area 340.

Figure 3:
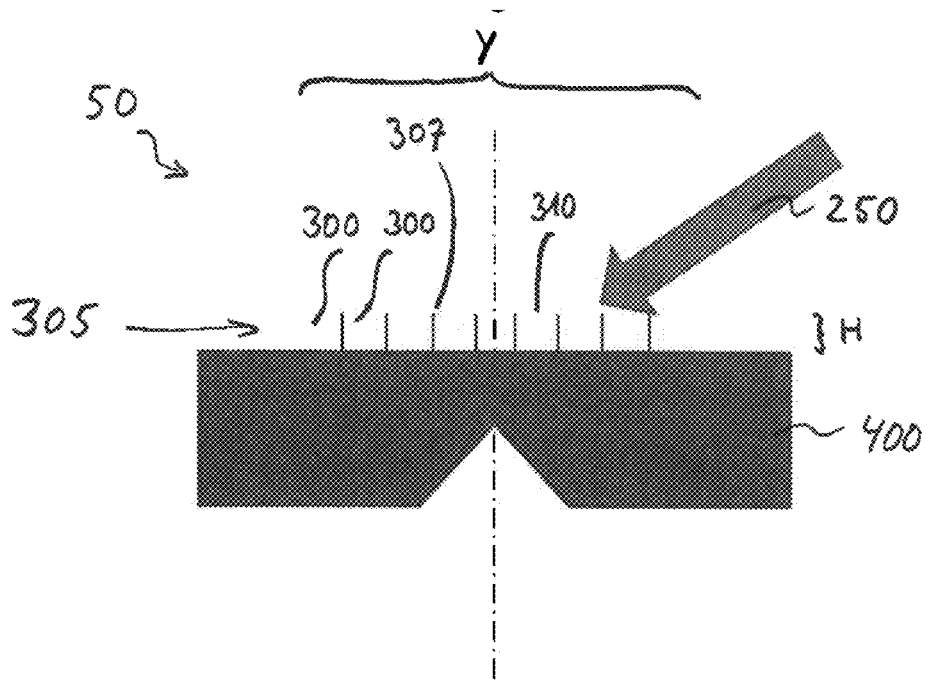
FIG. 3 shows a side view of a light conversion device having a heat sink and a light conversion arrangement having a plurality of light conversion elements (convertor array), wherein the light conversion device is designed for reflection operation.

FIG. 3 shows a light conversion device 50, which can be used e.g. for a lighting device 100, wherein the light conversion device 50 comprises a main body 400, which is embodied as a heat sink and on which is arranged a light conversion arrangement 305 having a multiplicity of light conversion elements 300 in a matrix. In the example illustrated, the individual light conversion elements 300 are completely separated from one another by trenches 307. The trenches 307 extend over the full height H or optionally over part of the height and also in each case over the full dimensions X, Y of the light conversion arrangement 305.

Figure 4:
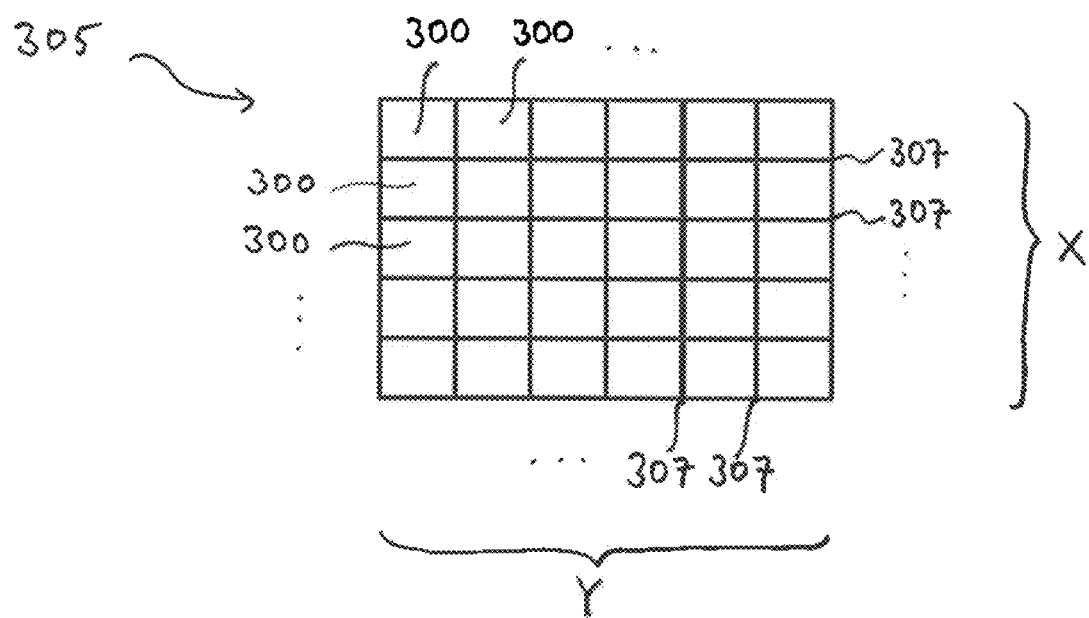
FIG. 4 shows a plan view of the light conversion arrangement of the light conversion device from FIG. 3.

FIG. 4 shows the light conversion arrangement 305 once again in plan view. The light conversion device 50 or the light conversion arrangement 305 is designed for reflection operation, that is to say is configured such that the light conversion arrangement 305 or the light conversion elements 300, on the front side 310 thereof, are illuminated with the primary light 250, that is to say e.g. a laser radiation.

Figure 5:
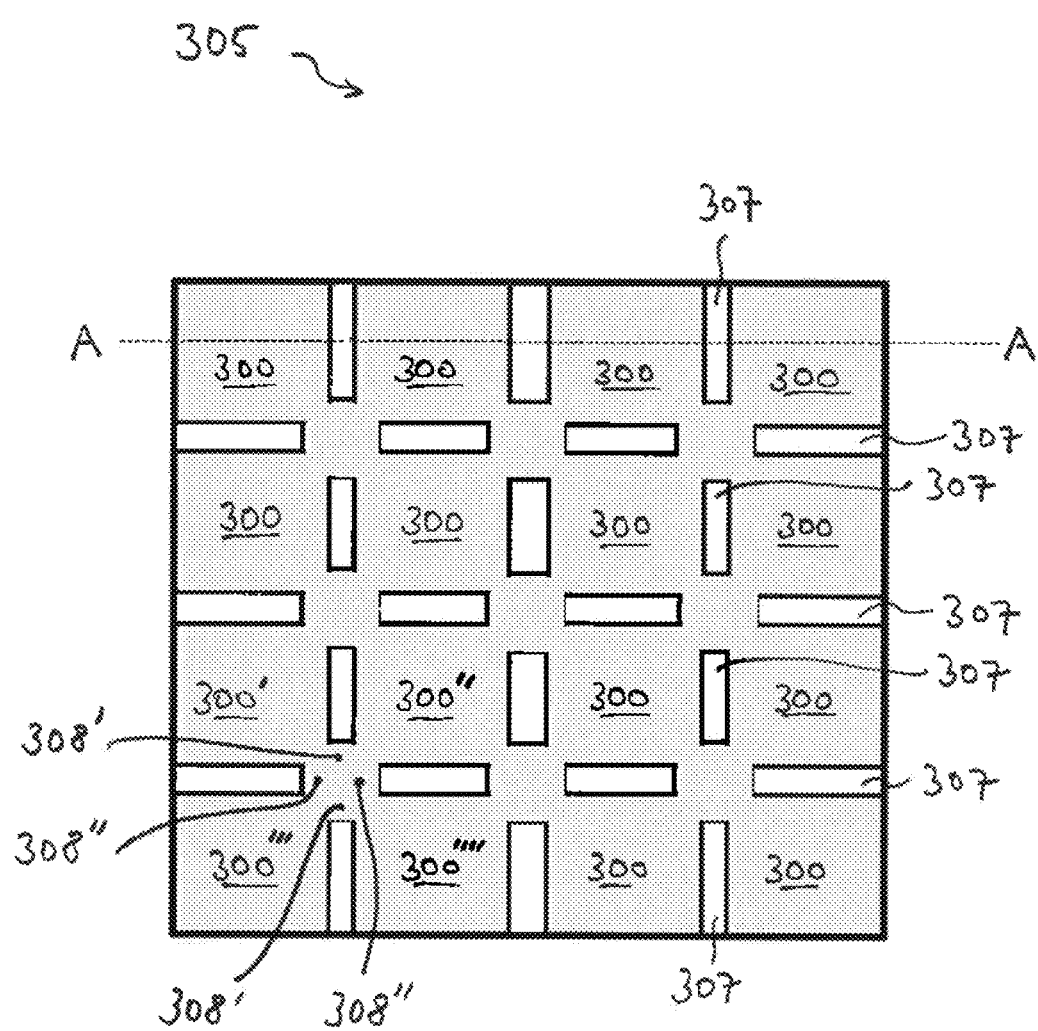
FIG. 5 shows a plan view of a further embodiment of a light conversion arrangement having a plurality of light conversion elements.

FIG. 5 shows a light conversion arrangement 305 having light conversion elements arranged in the form of a matrix, wherein adjacent light conversion elements 300 are separated from one another only regionally by a trench 307 embodied as a cutout. At the same time, the elements 300 are in each case connected among one another by a web 308. A segmented ceramic convertor wafer can be involved here, e.g. Ce:YAG, Ce:Gd:YAG. The trenches or the structuring can be introduced e.g. by means of laser ablation/drilling, etching (WCE) and/or bead blasting. In this case, e.g. light conversion elements 300, 300', 300'' and 300', 300'''' that are adjacent in columns are in each case connected to one another by a web 308'. Moreover, light conversion elements 300, 300', 300''' and 300'', 300'''' that are adjacent in rows are in each case connected to one another by a web 308''. There is correspondingly a connection between diagonally adjacent light conversion elements 300', 300'''' and 300'', 300''' as well.

Figure 6:
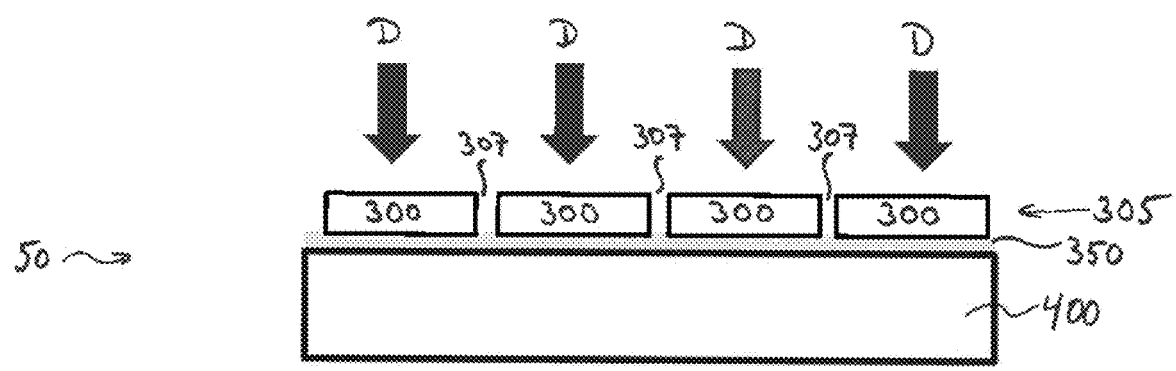
FIGS. 6-7 show a schematic illustration of a method for producing a light conversion device.
Figure 7:
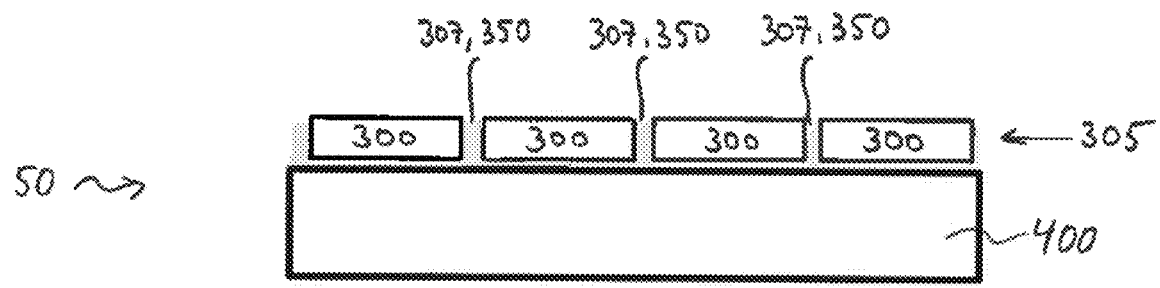

FIGS. 6 and 7 illustrate steps of a method for producing a light conversion device 50 and show the light conversion arrangement 305 from FIG. 5 in section A-A. A filling material/solder material 350 is applied on the main body 400, which is embodied as a heat sink and which can be embodied e.g. as copper substrate. The filling material/solder material 350 can be caused to soften or melt by heating, e.g. to a temperature of at least 150 degrees, preferably at least 200 degrees, particularly preferably at least 250 degrees. The light conversion arrangement 305 can therefore be pressed into the filling material/solder material 350 with pressure D being exerted. A first process step can be provided, for example, in which solder material 350 is heated and force is exerted on the light conversion arrangement 305 or the wafer, wherein the first process step can be effected e.g. in a vacuum furnace. By way of example, a material comprising or composed of SnAgCu and/or AuSn or a glass that has been processed to form a solder glass is considered as solder material 350. The solder glass can also be introduced or metered into the trenches/gaps as preform or paste material. In the preform embodiment, the solder glass is fabricated as a glass blank and placed as a lattice structure onto the light conversion arrangement. Afterward, the lattice-shaped preform is melted into the gap structure and the gaps are thus filled. Alternatively, the solder glass is drawn into the webs between conversion elements by way of the capillary forces. A second process step can consist in cooling the filling material/solder material 350 or allowing it to cool.

Figure 8:
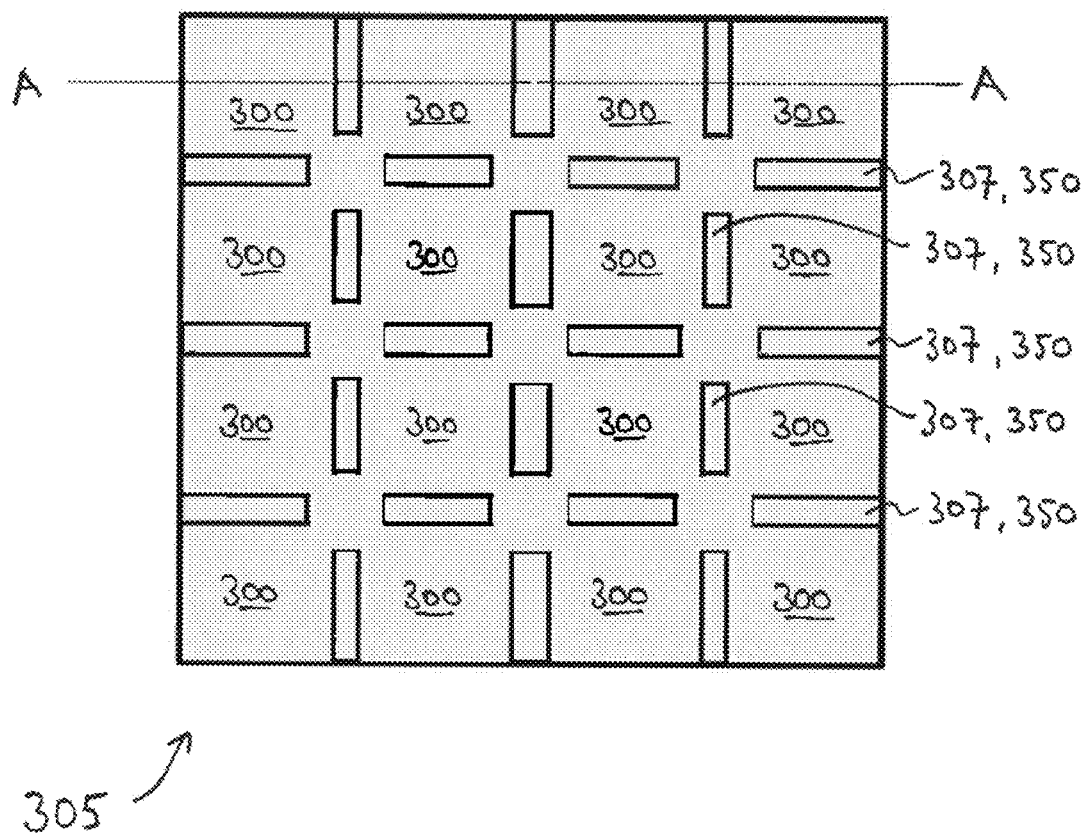
FIGS. 8-9 show a plan view of a further embodiment of a light conversion arrangement having a plurality of light conversion elements (FIG. 8) and a schematic illustration of a method for producing such a light conversion device (FIG. 9), FIGS. 10-12 each show a plan view of a further embodiment of a light conversion arrangement with schematic illustration of the trenches.

FIG. 8 shows a further light conversion arrangement 305 having light conversion elements 300 arranged in grid fashion, wherein the light conversion elements 300 are in turn separated from one another only regionally by a trench 307 embodied as a cutout, but at the same time are connected by a web 308 corresponding to the webs designated in FIG. 5. In principle, the explanations concerning FIG. 5 are applicable here, too; in contrast thereto, the trenches 307 here have already been filled with a preferably soft, e.g. pastelike, filling material 350. Silver paste (Ag paste), for example, can be provided for this purpose.

Figure 9:
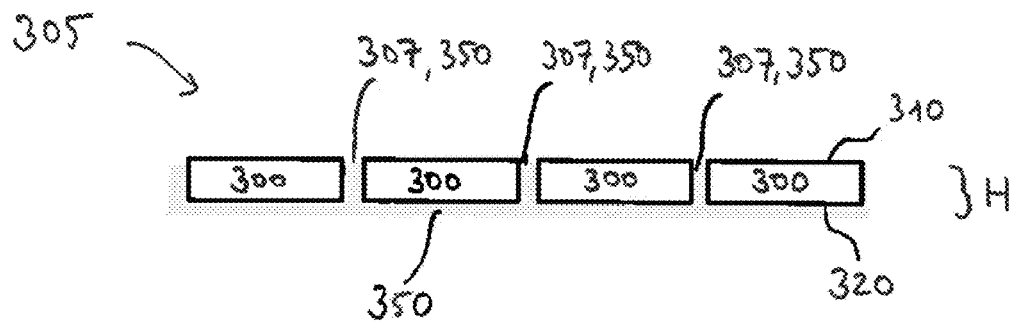

FIG. 9 shows that the filling material 350, that is to say the silver paste, for instance, can be applied to the rear side 320 of the light conversion arrangement 305, such that the filling material 350 punctuates into the trenches 307 from the rear side 320 in the direction of the front side 310, said trenches 307 extending through continuously according to height H. For this purpose, screen printing using silver paste can be effected from the rear side. The trenches 307 embodied as interspaces are thus coated and/or filled with an Ag layer from the rear side 320. Furthermore, provision can be made for the filling material 350, e.g. the silver paste, to be dried, by heating, e.g. to above 200 degrees, preferably to above 250 degrees, particularly preferably to above 300 degrees, wherein drying/heating can be effected in a furnace, in particular. Furthermore, provision can be made for firing the filling material, e.g. the silver paste, for which purpose an even higher temperature can be provided, for instance at least 600 degrees, preferably at least 700 degrees, particularly preferably at least 800 degrees.

Figure 10:
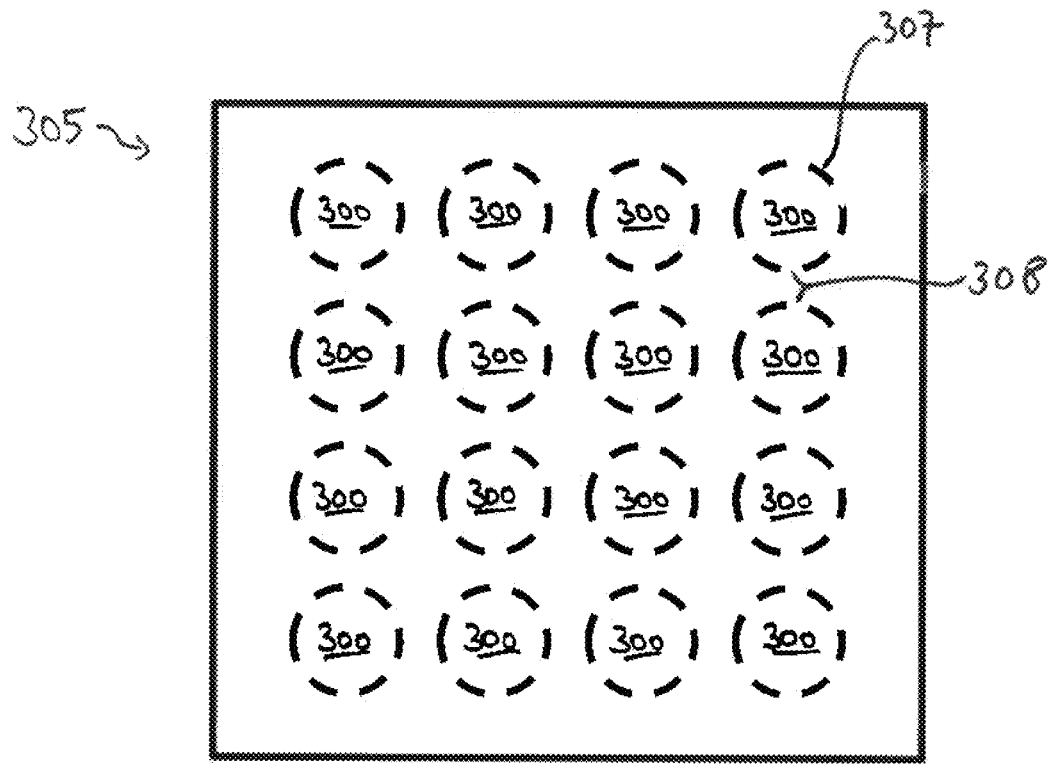
Figure 11:
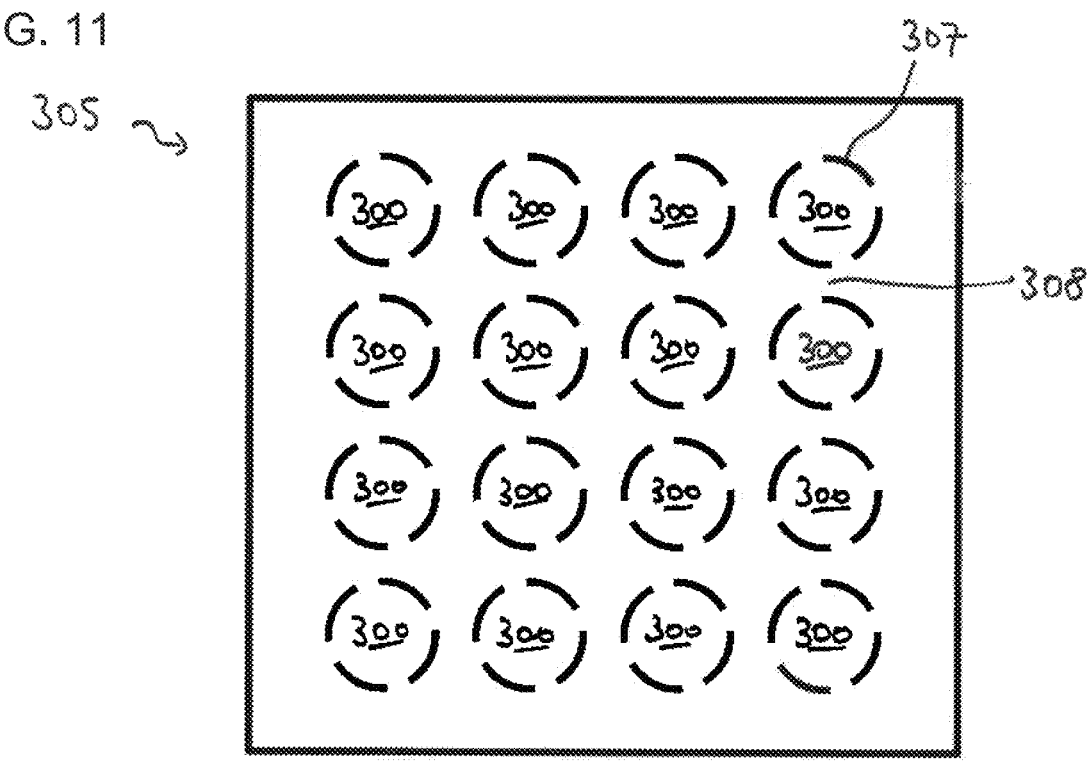
Figure 12:
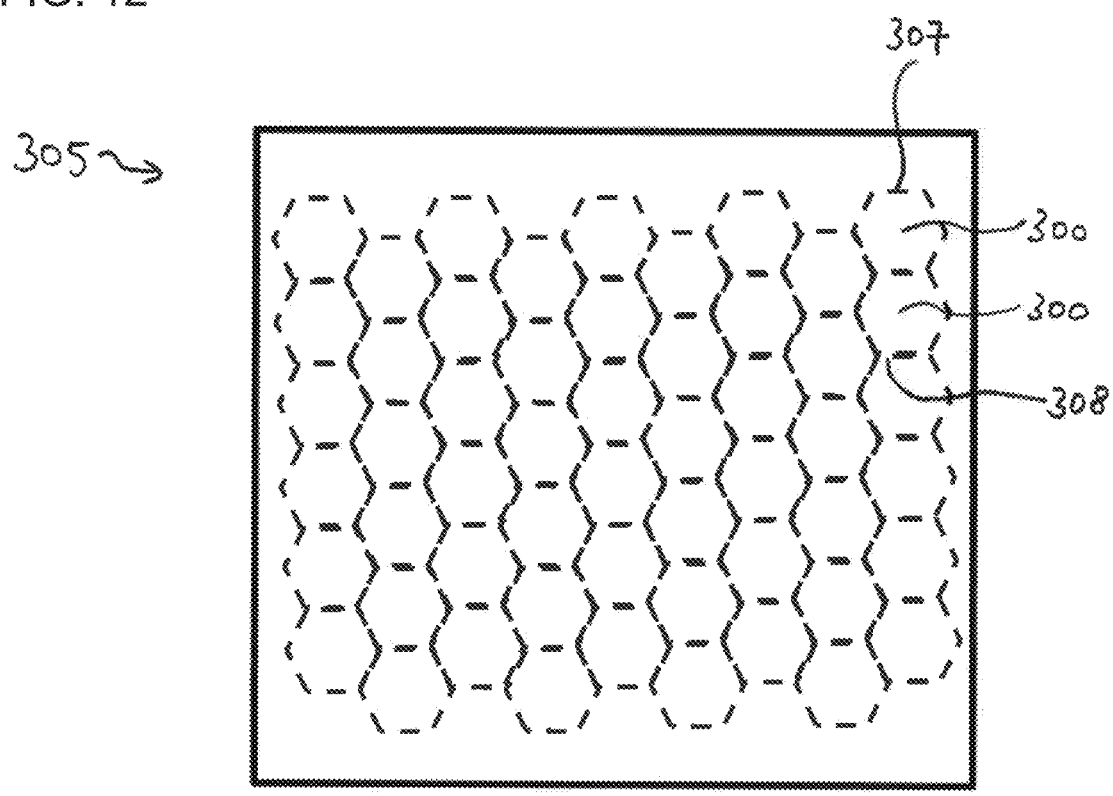

FIGS. 10-12 show further embodiments of light conversion arrangements 305 having a plurality of light conversion elements 300, wherein the light conversion elements 300 are in turn separated from one another only regionally by trenches 307, which here are illustrated schematically as black lines, but at the same time are connected to one another by connecting regions or webs 308. Particularly when the trenches 307 are connected mentally, the light conversion elements 300 can have for example a round shape (FIGS. 10 and 11) or a polygonal, e.g. hexagonal, shape (FIG. 12).

It is evident to the person skilled in the art that the embodiments described above should be understood to be by way of example and the invention is not restricted thereto, but rather can be varied in diverse ways, without departing from the scope of protection of the claims. Furthermore, it is evident that the features, irrespective of whether they are disclosed in the description, the claims, the figures or elsewhere, also individually define essential constituents of the invention, even if they are described jointly together with other features and can thus be regarded as being disclosed independently of one another. The description of features of one exemplary embodiment is applicable in each case for the other exemplary embodiments as well.

What is claimed is:

1. A light conversion device, comprising:
a main body comprising a heatsink; and
a light conversion arrangement on the main body, the light conversion arrangement comprising a plurality of light conversion elements separated from one another by a trench, the trench extending from the front side of the light conversion arrangement to the rear side,
wherein the plurality of light conversion elements each have a front side facing away from the main body, and
wherein the plurality of light conversion elements are each configured, when illuminated with primary light on the front side, to emit secondary light from the front side, the secondary light having a different wavelength than the primary light,
wherein the light conversion elements of the light conversion arrangement are connected to each other by a web, the web consisting of the same material as the light conversion elements.

2. The light conversion device of claim 1, wherein the trench comprises a filling material, wherein the filling material differs from a material of the plurality of light conversion elements.

3. The light conversion device of claim 2, wherein the filling material has a coefficient of thermal expansion that differs from a coefficient of thermal expansion of the material of the plurality of light conversion elements by less than $1*10^{-6}$ $K^{-1}$.

4. The light conversion device of claim 2, wherein the filling material is selected from a group consisting of a metal, a metal alloy, SnAgCu, AuSn, Ag, glass, glass paste, solder glass, solder glass ceramic, black glass, silicone, epoxy resin, and polymer.

5. The light conversion device of claim 1, wherein the plurality of light conversion elements has an arrangement selected from a group consisting of a row, a plurality of rows, a column, a plurality of columns, and a matrix.

6. The light conversion device of claim 1, wherein the plurality of light conversion elements each have a shape selected from a group consisting of a polygonal shape, a rectangular shape, a square shape, a hexagonal shape, a round shape, and a circular shape.

7. The light conversion device of claim 1, further comprising a web that connects the plurality of light conversion elements to each other.

8. A lighting device, comprising:
a light conversion device having a main body and a light conversion arrangement, the main body being on a back side of the light conversion arrangement, the light conversion arrangement comprising a front side with a plurality of light conversion elements that are separated from one another by a trench, the trench extending from the front side of the light conversion arrangement to the rear side, wherein the light conversion elements of the light conversion arrangement are connected to each other by a web, the web consisting of the same material as the light conversion elements; and
a light emission unit configured to emit primary light on the front side, wherein the plurality of light conversion elements are each configured to convert the primary light and to a secondary light and to emit the secondary light from the front side, and wherein the secondary light has a different wavelength than the primary light.

9. The lighting device of claim 8, wherein the light emission unit illuminates a primary light receiving area of the plurality of light conversion elements, wherein the primary light receiving area has a size equal to or smaller than the front side of each of the plurality of light conversion elements.

10. The lighting device of claim 9, wherein the light emission unit has a luminance of at least 50 cd/mm$^2$.

11. The lighting device of claim 9, wherein the light emission unit radiates the primary light onto the plurality of light conversion elements along an optical axis that is at an angle of greater than 30 degrees with respect to a normal axis of the plurality of light conversion elements and/or with respect to an optical axis of the secondary light.

12. The lighting device of claim 9, wherein the light emission unit comprises a device selected from a group consisting of a light source, a laser light source, a light guide, a fiber optic light guide, a lens, and combinations thereof.

13. A light conversion arrangement, comprising a plurality of light conversion elements separated from one another regionally by a trench, the trench extending from the front side of the light conversion arrangement to the rear side, wherein the light conversion elements of the light conversion arrangement are connected to each other by a web, the web consisting of the same material as the light conversion elements.

14. The light conversion arrangement of claim 13, wherein the trench is filled with a filling material, the filling material having a different coefficient of thermal expansion than a material of the plurality of light conversion elements.

15. The light conversion arrangement of claim 13, wherein the filling material is selected from a group consisting of a metal, a metal alloy, SnAgCu, AuSn, Ag, glass, glass paste, solder glass, solder glass ceramic, black glass, silicone, epoxy resin, and polymer.

16. The light conversion arrangement of claim 13, wherein the plurality of light conversion elements each have a shape selected from a group consisting of a polygonal shape, a rectangular shape, a square shape, a hexagonal shape, a round shape, and a circular shape.

17. The light conversion arrangement of claim 13, further comprising a web that connects the plurality of light conversion elements to each other.

18. A method for producing a light conversion device, comprising:
providing an original light conversion element;
arranging a back side of the original light conversion element on a main body; and
introducing a trench into the original light conversion element to define a plurality of light conversion elements regionally separated from one another the trench, the trench extending from the front side of the light conversion arrangement to the rear side, wherein the light conversion elements of the light conversion arrangement are connected to each other by a web, the web consisting of the same material as the light conversion elements.

19. The method of claim 18, further comprising filling the trench with a filling material that has a different coefficient of thermal expansion than the plurality of light conversion elements by less than $1*10^{-6}$ $K^{-1}$.

20. The method of claim 18, wherein the step of introducing the trench comprises introducing a plurality of trenches so that the plurality of light conversion elements has an arrangement selected from a group consisting of a row, a plurality of rows, a column, a plurality of columns, and a matrix.

21. The method of claim 18, wherein the step of introducing the trench comprises introducing a plurality of trenches so that the plurality of light conversion elements each have a shape selected from a group consisting of a polygonal shape, a rectangular shape, a square shape, a hexagonal shape, a round shape, and a circular shape.

22. The method of claim 18, wherein the step of introducing the trench comprises leaving a web between each of the plurality of light conversion elements.

23. The method of claim 18, wherein the step of introducing the trench comprises using a process selected from a group consisting of laser ablation, laser drilling, wet chemical etching, sawing, bead blasting, and combinations thereof.

* * * * *